United States Patent [19]
Okajima et al.

[11] Patent Number: 5,301,148
[45] Date of Patent: Apr. 5, 1994

[54] SEMICONDUCTOR MEMORY DEVICE WITH BIPOLAR-FET SENSE AMP

[75] Inventors: Yoshinori Okajima, Kawasaki; Yasuhiko Maki, Yokohama, both of Japan

[73] Assignee: Fujitsu Limited, Kanagawa, Japan

[21] Appl. No.: 965,628

[22] Filed: Oct. 22, 1992

Related U.S. Application Data

[63] Continuation of Ser. No. 561,635, Aug. 2, 1990, abandoned.

[30] Foreign Application Priority Data

Aug. 4, 1989 [JP] Japan .................. 1-203004

[51] Int. Cl.⁵ .................. G11C 11/40; G11C 7/06
[52] U.S. Cl. .................. 365/777; 365/189.05; 365/190; 365/208; 365/225.6
[58] Field of Search .................. 365/225.06, 189.05, 365/177, 207, 208, 190

[56] References Cited

U.S. PATENT DOCUMENTS

| | | | |
|---|---|---|---|
| 4,326,270 | 4/1982 | Owens et al. | 365/225.6 |
| 4,349,895 | 9/1982 | Isogai | 365/225.6 |
| 4,369,503 | 1/1983 | Isogai | 365/225.6 |
| 4,385,370 | 5/1983 | Isogai | 365/225.6 |
| 4,831,597 | 5/1989 | Fuse | 365/177 |
| 4,853,899 | 8/1989 | Kitsukawa et al. | 365/207 |
| 5,046,050 | 9/1991 | Kertis | 365/177 |
| 5,091,879 | 2/1992 | Tran | 365/177 |

Primary Examiner—Joseph E. Clawson, Jr.
Attorney, Agent, or Firm—Nikaido, Marmelstein, Murray & Oran

[57] ABSTRACT

A semiconductor memory device, includes a memory cell array, a row decoder connected to the memory cell array by a plurality of word lines for selecting a word line in response to a first address signal supplied thereto, a column decoder connected to the memory cell array by a plurality of bit lines for selecting a bit line in response to a second address signal supplied thereto, and a data discrimination unit connected to the column decoder by a common data bus for producing an output data signal indicative of the data stored in the addressed memory cell. The column decoder includes a plurality of sense amplifiers each connected to a corresponding bit line for selecting an addressed bit line. The plurality of sense amplifiers are connected to a common data bus for carrying data stored in the addressed memory cell. A plurality of switching devices are provided in correspondence to the plurality of sense amplifiers for selectively transferring the data detected by the sense amplifier to the common data bus. Wherein each of the switching devices includes a bipolar transistor having a collector connected to a power voltage source, an emitter connected to the common data bus, and a base connected to the corresponding sense amplifier for receiving the output signal of the sense amplifier indicative of the data.

5 Claims, 7 Drawing Sheets

SEMICONDUCTOR MEMORY DEVICE WITH BIPOLAR-FET SENSE AMP

This application is a continuation of application Ser. No. 561,635 filed Aug. 2, 1990 now abandoned.

BACKGROUND OF THE INVENTION

The present invention generally relates to semiconductor memory devices and more particularly to a semiconductor memory device having an improved access time.

In semiconductor memory devices, delay at the time of reading or writing data is caused by various reasons. Among others, contribution of peripheral circuits occupies a significant part. It should be noted that the delay caused by the peripheral circuits is much larger than the delay caused by the memory cell itself. Such peripheral circuits include sense circuits and decoders.

FIG. 1 shows a construction of a typical conventional semiconductor memory device.

Referring to FIG. 1, semiconductor memory device comprises a memory cell array 1 including a number of memory cells 1a arranged in a row and column formation, a row decoder 2 connected to word lines WL for addressing a memory cell 1a connected to one of the word lines in response to an address signal ADDRESS1 supplied thereto, a column decoder 3 acting also as a sense circuit as well as a write circuit, connected to bit lines for addressing a memory cell 1a connected to a pair of addressed bit lines BL and $\overline{BL}$ in response to another address signal ADDRESS2. Further, an output buffer circuit 4a and a read write control circuit 4b are provided for reading data from the addressed memory cell and writing data to the addressed memory cell respectively.

FIG. 2 shows a construction of the circuit 3 in detail. Only the part of the circuit 3 which is used for reading the data is illustrated. Referring to FIG. 2, a number of sense amplifiers 11–14, each comprising a transistor 5 and a transistor 6, are connected to corresponding pairs of bit lines BL1 and $\overline{BL1}$, BL2 and $\overline{BL2}$, BL3 and $\overline{BL3}$, and BL4 and $\overline{BL4}$ and so on. Further, there are provided a common data bus pair 8 and 9 wherein the data bus 8 is connected commonly to the collector of the transistor 5 forming the sense amplifiers 11–14 and the data bus 9 is connected commonly to the collector of the transistor 6 also forming the sense amplifiers 11–14. The buses 8 and 9 are connected to the output buffer circuit 4a which is a sense amplifier for detecting the difference in the current flowing through the buses 8 and 9. In response to the detected difference, the output buffer circuit 4a produces a data signal at an output terminal $D_{OUT}$.

FIG. 3 shows a construction of the output buffer circuit 4a used for detecting the difference in the current between the bus 8 and the bus 9. As can be seen from FIG. 3, the output buffer circuit 4a comprises a differential amplifier 4a, having a well known construction and produces a high level output at the output terminal $D_{OUT}$ when the voltage level on the bus 8 is higher than that on the bus 9. Otherwise, the amplifier 4a' produces a low level output at the output terminal $D_{OUT}$. As the construction and operation of such a differential amplifier is well known, further description thereof will be omitted.

Each of the sense amplifiers 11–14 includes the transistor 5 and the transistor 6 wherein the transistor 5 having the collector connected to the bus 8 has a base connected to the bit line BL and an emitter connected, commonly to the emitter of the transistor 6, to a current source 7. Similarly, the transistor 6 having the collector connected to the bus 9 has a base connected to the bit line $\overline{BL}$ and an emitter connected, commonly to the emitter of the transistor 5, to the current source 7. The current source 7 is selectively turned on in response to a column select signal which is produced by decoding the address signal ADDRESS2 by a decoding unit 3a shown in FIG. 4.

FIG. 4 shows the construction of the current source 7 in more detail. Referring to FIG. 4, the current source 7 comprises a field effect transistor connecting the emitters of the transistors 5 and 6 to the ground. The transistor 7 has a gate to which the column select signal produced by the decoding unit 3a is supplied and the transistor 7 is turned off and turned on in response to the address data ADDRESS2 supplied to the decoding unit 3a.

Thus, when the sense amplifier 1 is selected in response to the turning on of the current source 7, a current may be caused to flow either from the bus 8 to the current source 7 through the transistor 5 or from the bus 9 to the current source 7 through the transistor 6 depending on the content of information stored in the selected memory cell 1a. Thus, when there is a high level state in the bit line BL1, a current is caused to flow from the bus 8 to the current source 7 through the collector and emitter of the transistor 5. In correspondence to the high level state in the bit line BL1, a low level state appears in the bit line $\overline{BL}$, and flow of the current through the transistor 6 is prohibited. Thus, there appears an inequality in the current flowing through the bus 8 and the bus 9, and this inequality of the current is detected by the sense amplifier 4a. When the high level state is on the bit line BL and the low level state on the bit line $\overline{BL}$, on the other hand, a reversed situation appears such that the current flows from the bus 9 to the current source 7 through the transistor 6 while flowing of the current through the transistor 5 is prohibited.

Although such a so-called "collector dot" construction of the memory device is effective in reducing the delay of the decoding circuit, there still remains a problem in that the response of the memory device is not satisfactorily fast.

FIG. 5 explains the reason why a satisfactorily quick response cannot be obtained in the foregoing construction. Referring to FIG. 5 showing the cross-sectional view of a transistor used for the transistors 5 and 6, the transistor has an n+-type buried collector layer 22 provided on a p-type substrate 21, and an n-type collector layer 23, p-type base layer 24 and an n-type emitter layer 25 are provided on the buried collector layer 22. Further, it will be seen that the transistors are isolated from each other by an isolation structure 26 forming a p-n junction. Although such transistors are easy to fabricate with reduced number of fabrication steps, there is a problem that a large capacitance appears at the boundary between the substrate 21 and the buried collector layer 22 forming a p-n junction and at the boundary between the collector layer 23 and the base layer 24 also forming a p-n junction. It should be noted that junction between the substrate 21 and the collector layer 22 or the junction between the collector layer 23 and the base layer 24 has a substantial area. Because of this, there appears a substantial capacitance such as $C_{sub}$ or $C_{CB}$ at the collector of the transistors 5 and 6. Such a capacitance at the collector of the transistors 5 and 6 connected to the buses 8 and 9 inevitably causes a delay at the time of reading the data and the access characteristic of the memory device is deteriorated.

It should be noted that these parasitic capacitance connected parallel with each other to the bus 8 or 9 can cause a significant delay at the time of operation of the memory device.

Such a parasitic capacitance may be reduced by using the isolation structure formed of grooves as shown in FIG. 6. Referring to FIG. 6, there are provided isolation grooves 26, in place of the isolation structure 26 of junction type of FIG. 5. Other parts are identical to the structure of FIG. 5 and further description of the device of FIG. 6 will be omitted. It should be noted that the area of the p-n junction formed along the interface between the collector layer 23 or the buried collector layer 22 and the substrate 21 is substantially reduced by replacing the p-type region 26 by the groove 26'. However, such an isolation structure using the groove is disadvantageous from the viewpoint of yield and fabrication cost.

SUMMARY OF THE INVENTION

Accordingly, it is a general object of the present invention to provide a novel and useful semiconductor memory device wherein the foregoing problems are eliminated.

Another object of the present invention is to provide a semiconductor memory device having an improved response and a reduced access time.

Another object of the present invention is to provide a semiconductor memory device comprising a memory cell array including a plurality of memory cells arranged in a row and column formation for storing data, each of the memory cells being connected to a word line and a bit line for addressing a memory cell, and a column decoder connected to the memory cell array by a plurality of bit lines, the column decoder including a plurality of sense amplifiers each connected to a corresponding bit line and addressed selectively by an address signal supplied thereto for detecting the data stored in an addressed memory cell to which the sense amplifier is connected by the bit line, a common data bus connected commonly to the plurality of sense amplifiers for carrying data stored in the addressed memory cell, and a plurality of switch devices provided in correspondence to the plurality of sense amplifiers for transferring the data detected by the addressed sense amplifier to the common data bus, wherein each of the switch devices comprises a bipolar transistor having a collector connected to the ground, an emitter connected to the common data bus, and a base connected to the corresponding sense amplifier for receiving an output signal of the sense amplifier indicative of the data. According to the present invention, the delay at the time of reading the data is substantially reduced by using the emitter follower construction of the bipolar transistor for the bipolar transistors forming the switch devices.

Other objects and further features of the present invention will become apparent from the following detailed description when read in conjunction with attached drawings.

DETAILED DESCRIPTION

Figure 7A:
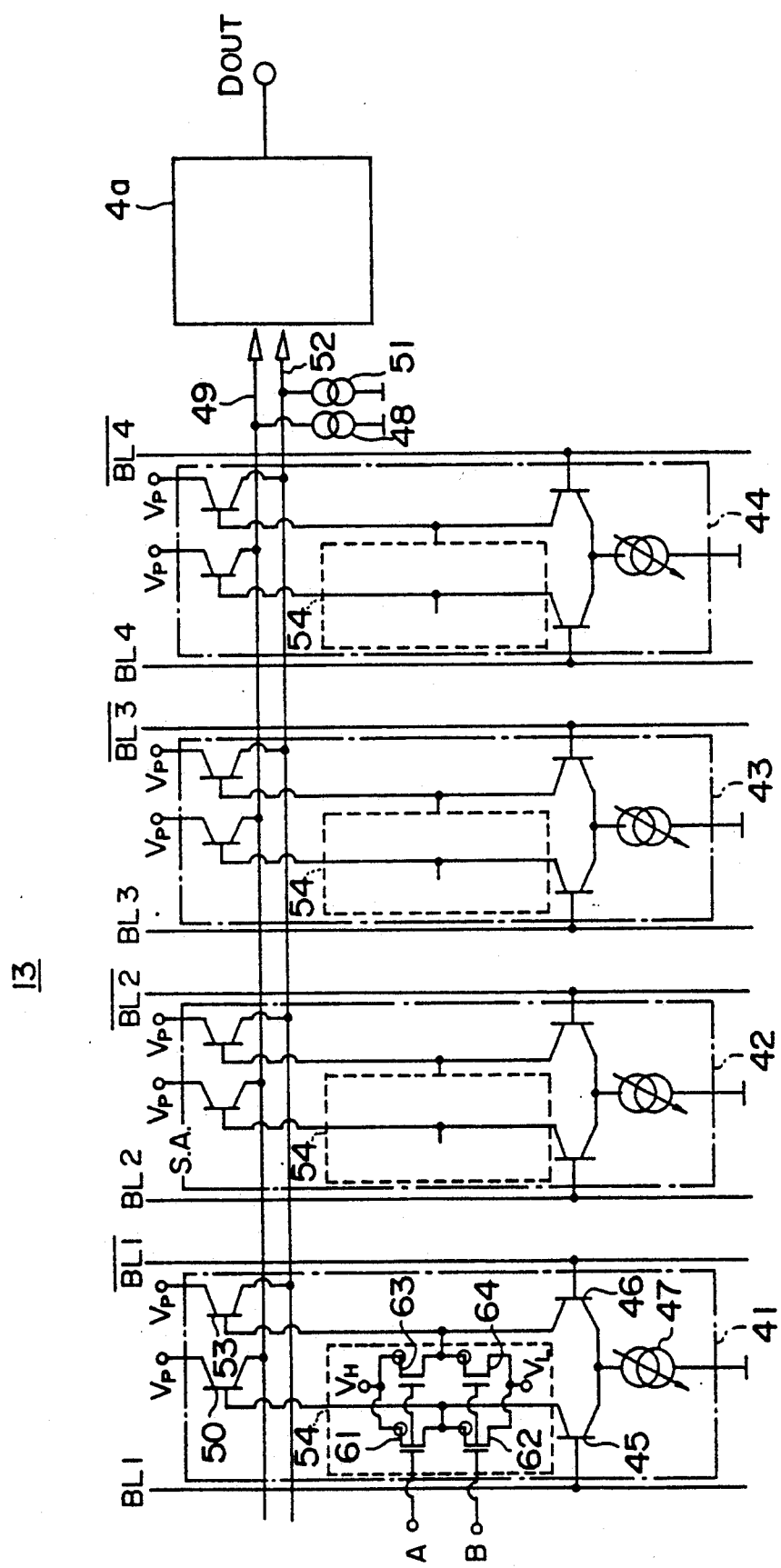
FIG. 7A is a circuit diagram showing a first embodiment of the present invention.
Figure 7B:
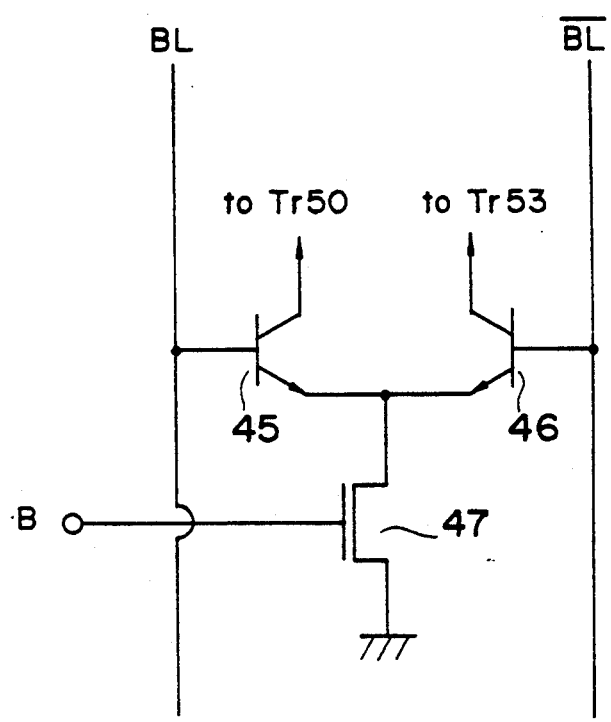
FIG. 7B is a circuit diagram showing a part of the circuit of FIG. 7A in detail.

Hereinafter, the present invention will be described with reference to FIGS. 7A and 7B showing a first embodiment. In the present embodiment, the semiconductor memory device has a construction substantially identical to that of FIG. 1 except for the column decoder 3 which is now replaced by a column decoder 13 which also acts as the sense and write circuit.

Figure 1:
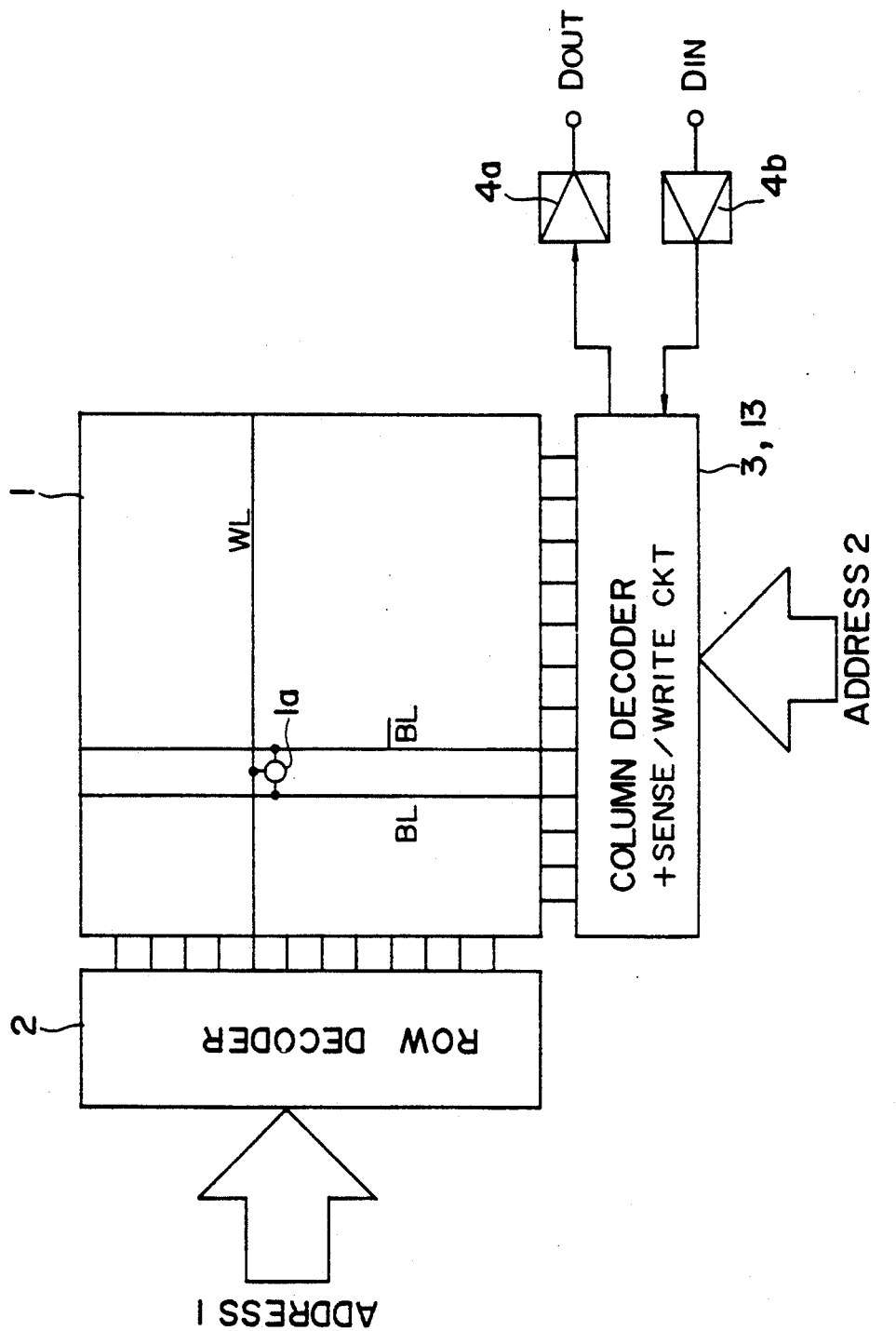
FIG. 1 is a block diagram showing the general construction of a conventional semiconductor memory device.
Figure 4:
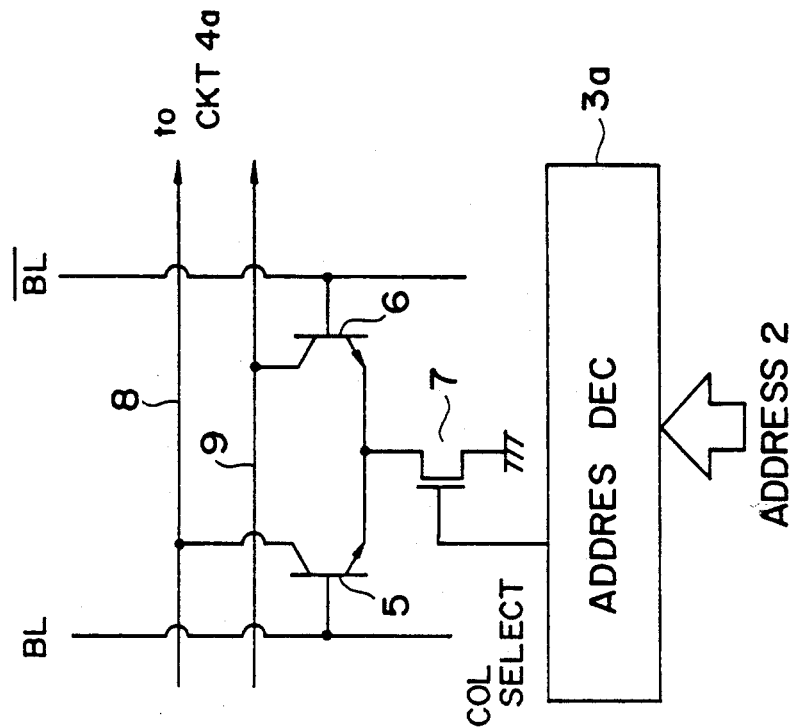
FIG. 4 is a circuit diagram showing a part of the device of FIG. 1.

It should be noted that, in FIG. 1, the memory cell array 1 and the row decoder 2 have well known constructions and the description thereof will be omitted. Similarly, the address decoder 3a shown in FIG. 4 has a well known construction and the description thereof will be omitted.

Referring to FIG. 7A showing the column decoder 13, a number of sense amplifiers 41, 42, 43, 44, each comprising a pair of bipolar transistors 45 and 46, are connected to respective bit line pairs BL1 and $\overline{BL1}$, BL2 and $\overline{BL2}$, BL3 and $\overline{BL3}$, and BL4 and $\overline{BL4}$.

In the case of the sense amplifier 41 connected to the bit lines BL1 and $\overline{BL1}$, the transistor 45 has a base connected to the bit line BL1 and an emitter connected to a selectively activated current source 47 to be described later. Further, the transistor 45 has a collector connected to a base of a transistor 50 forming a switching element. Similarly, the transistor 46 has a base connected to the bit line $\overline{BL1}$ and an emitter connected, commonly to the emitter of the transistor 45, to the selectively activated current source 47. The collector of the transistor 46 is connected to the base of a bipolar transistor 53 acting as a switching device together with the transistor 50.

Figure 2:
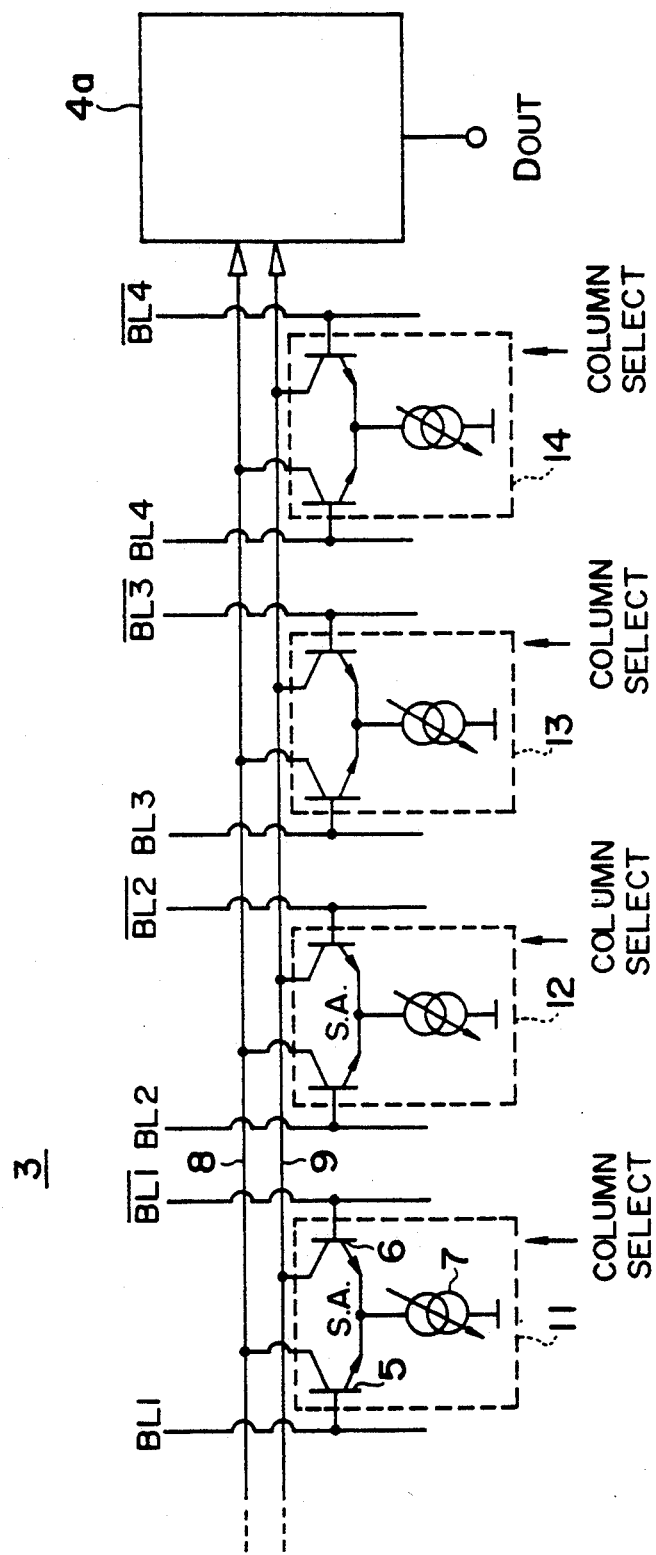
FIG. 2 is a circuit diagram showing a part of the device of FIG. 1.

The transistor 50 has a collector connected to a voltage source $V_P$ and an emitter connected to a common data bus 49. Similarly, the transistor 53 has a collector connected to the voltage source $V_P$ and an emitter connected to a common data bus 52. The data bus 49 and the data bus 52 extend to the output buffer circuit 4a similarly to the buses 8 and 9 of FIG. 2, and a number of other sense amplifiers 42–44, each having a construction identical to the sense amplifier 41, are connected commonly thereto as illustrated in FIG. 7A.

Further, a clamp circuit 54 is connected to respective collectors of the transistors 45 and 46 as shown in FIG.

7A. Referring to FIG. 7A, the clamp circuit 54 includes p-channel type MOS transistors 61 and 63 connected parallel with each other, with respective gates connected commonly to an input terminal A and respective sources connected commonly to a positive voltage source $V_H$. Further, the clamp circuit 54 includes another pair of p-channel MOS transistors 62 and 64 connected parallel with each other, with respective gates connected commonly to an input terminal B and respective sources connected to respective drains of the transistors 61 and 63. The drains of the transistors 62 and 64 are connected commonly to a negative voltage source $V_L$, and the drain of the transistor 61 is connected, commonly with the collector of the transistor 45, to the base of the transistor 50. Similarly, the drain of the transistor 63 is connected, commonly with the collector of the transistor 46, to the base of the transistor 53.

As the construction of the sense amplifiers 41-44 are identical with each other, the description with respect to the sense amplifiers 42-44 will be omitted.

FIG. 7B shows the circuit diagram of the selectively activated current source 47 used in the sense amplifiers 41-44. As can be seen from this drawing, the current source 47 actually comprises an n-channel MOS transistor having its source connected to the ground and the drain connected to the emitter of the bipolar transistors 45 and 46. The MOS transistor 47 has a gate which is connected to commonly to the input terminal B.

Next, the operation of the memory device of FIG. 7A will be described.

When the sense amplifier 41 is selected, a low level signal L is supplied to the input terminal A while a high level signal H, which is the inversion of the signal L, is supplied to the input terminal B.

In response to the signal H to the input terminal B, the n-channel MOS transistor forming the current source 47 is turned on. Further, the p-channel MOS transistors 61 and 63 connected to the input terminal A are turned on in response to the input signal L to the input terminal A and the n-channel MOS transistors 62 and 64 are turned off in response to the signal H to the input terminal B. Thereby, the positive voltage $V_H$ is supplied to the collector of the transistors 45 and 46 after passing through the MOS transistors 61 and 63 which act as the load resistance, to the transistors 45 and 46.

Figure 3:
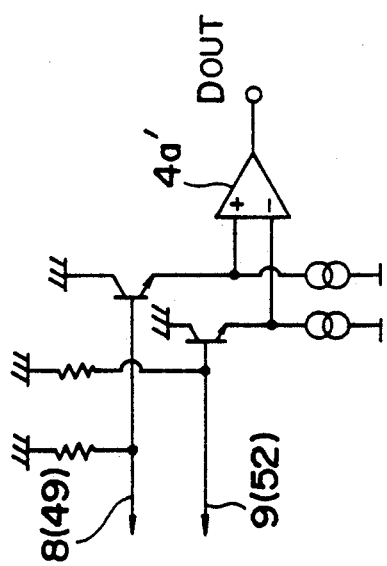
FIG. 3 is a circuit diagram showing an amplifier used in the device of FIG. 1.

Now, when the bit line BL1 is in the high level state reflecting the logic data "1" stored in the addressed memory cell 1a, the transistor 45 is turned on and current flows through the transistor 45 from the collector to the emitter. Thereby, the voltage at the base of the transistor 50 becomes low and the transistor 50 connected to the common data bus 49 is turned off. At teh same time to the high level slate of the bit line BL1, a low level state appears on the conjugate bit line $\overline{BL1}$ and in response to the low level state of the bit line $\overline{BL1}$, the transistor 46 is turned off. Thereby, the base voltage of the transistor 53 becomes high and the transistor 53 is turned on. As a result, a current flows through the common data bus 52 from the voltage source $V_P$. As there are constant current sources 48 and 51 connected to the common data bus 49 and 52 respectively, a high level voltage appears on the common data bus 52 and a low level voltage appears on the common data bus 49. The output buffer circuit 4 which may be a differential amplifier shown in FIG. 3 detects the voltage difference between the data bus 49 and the data bus 52, and produces a data output at the output terminal $D_{OUT}$ indicative of the logic data "1".

In the case where the voltage level on the bit line BL1 is low and the voltage level on the bit line $\overline{BL1}$/0 is high in correspondence to the logic level "0" stored in the memory cell 1a, a reversed state appears wherein a high level output is obtained on the bus 49 and a low level output is obtained on the bus 52. In response thereto, output data indicative of the logic data "0" is obtained at the output terminal $D_{OUT}$. As the operation of the device in this case is obvious from the foregoing description, further description will be omitted.

When the sense amplifiers 41-44 are not addressed, signals with reversed states are applied to the input terminals A and B. Thus, the low level signal L is applied to the input terminal A and the high level signal H is applied to the input terminal B. In this case, the current source 47 is disabled in response to the low level signal L to the input terminal B (see FIG. 7B), and the transistors 45 and 46 forming the sense amplifier are both turned off. Further, the transistors 62 and 64 are turned on in response to the low level signal L at the input terminal B while the transistors 61 and 63 are turned off in response to the high level signal H at the input terminal A. As a result, the negative voltage $V_L$ is supplied, after passing through the transistors 62 and 64 acting as the load resistance, to the base of the transistors 50 and 53 irrespective of the voltage level of the bit lines BL and $\overline{BL}$, and the transistors 50 and 53 are both turned off. Thereby, no voltage signal is supplied to the common data bus 49 or 52 from the non-selected sense amplifiers. Only the voltage from the selected sense amplifiers are supplied to these data buses and a reliable reading operation is achieved.

Figure 5:
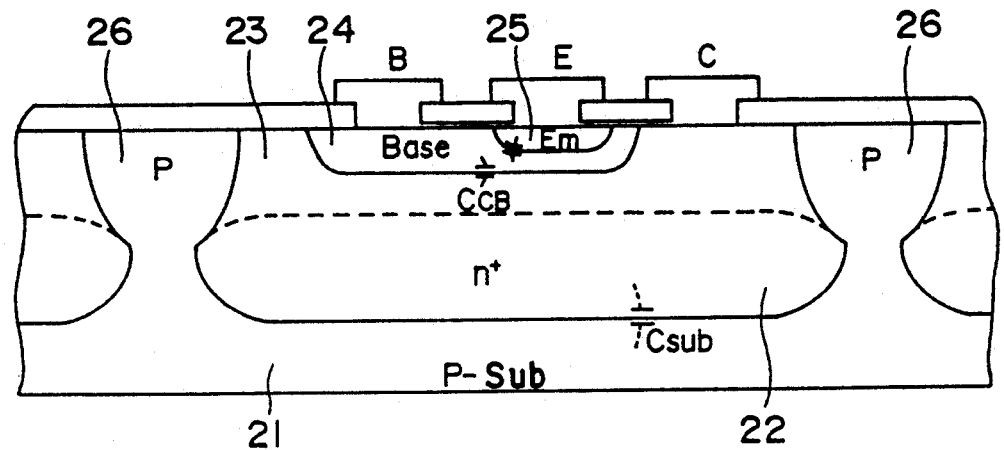
FIG. 5 is a cross-sectional view showing the structure of a conventional bipolar transistor used in the device of FIG. 1.
Figure 6:
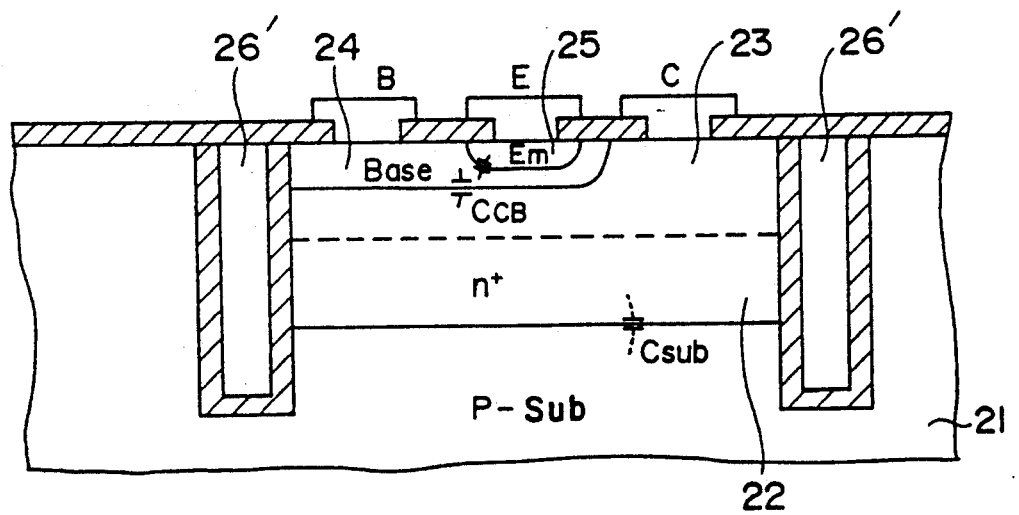
FIG. 6 is a cross-sectional view similar to FIG. 5 showing another example of the bipolar transistor used in the device of FIG. 1.

It should be noted that, in the present embodiment, the common data bus such as the bus 49 or the bus 52 are connected to the emitter of the bipolar transistor 50 or 53. As can be seen from the cross-sectional view of the transistor of FIG. 5, the interface between the emitter and base of the bipolar transistors has a substantially reduced area, and the adversary effect due to the parasitic capacitance on the signal transfer on the common data bus is effectively minimized. It should be noted that the emitter and base of the transistors 50 and 53 in the non-selected sense amplifiers are all strongly reverse biased and the effect of the parasitic capacitance is further reduced.

Another advantage of the present invention is that such an emitter follower construction of the transistors 50 and 53 provides a large common emitter current gain which enables to flow a large current through the data buses 49 and 52. Thereby, the remaining parasitic capacitance is, if any, charged up immediately and the delay in transfer of signals along the bus is minimized. Because of these preferable features pertinent to the present invention, the semiconductor memory device of the present invention operates at a high speed and reading of data can be performed with reduced access time. Further, the semiconductor device allows the use of bipolar transistors having the junction isolation structure for the transistors 50 and 53 without sacrificing the operational performance. Thus, the yield of fabrication of the device is improved and the cost of fabricating the memory device is reduced.

Figure 8:
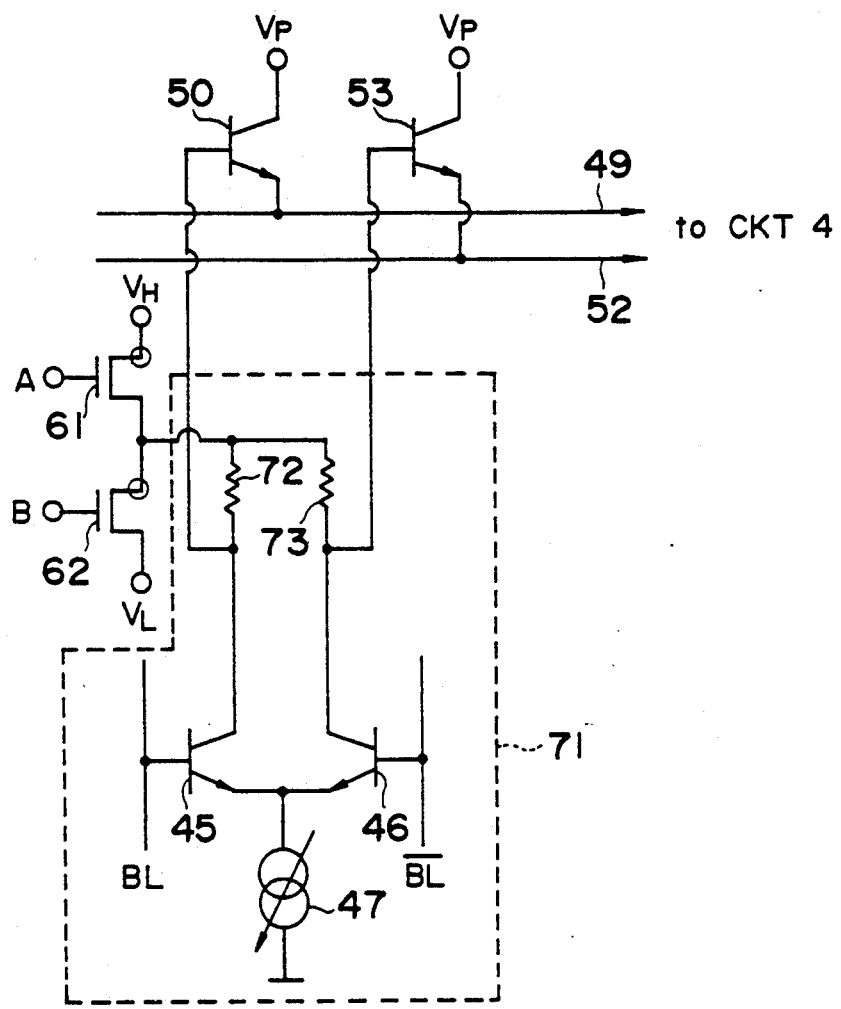
FIG. 8 is a circuit diagram showing a second embodiment of the present invention.

FIG. 8 shows a second embodiment of the present invention. In this embodiment, the sense amplifier shown by a numeral 71 has the drain of the p-channel MOS transistor 61 and the source of the p-channel MOS transistor 62 connected together similarly to the first embodiment, and the drain of the transistor 61 and the source of the transistor 62 are connected to the base of the transistors 50 and 53 respectively via a load resistance 72 and a load resistance 73.

In operation, when an input signal having the level L is supplied to the input terminal A and an input signal having the level H to the input terminal B in correspondence to the selection of the sense amplifier 71, the transistor 61 is turned on while the transistor 62 is turned off, and the source voltage $V_H$ at the source of the transistor 61 is supplied to the base of the transistors 50 and 53 respectively via the load resistances 72 and 73. Thereby, the base voltage of the transistors 50 and 53 are determined in response to the content of the data stored in the addressed memory cell 1a similarly to the case of the first embodiment. When the sense amplifier 71 is not selected, the signal H is supplied to the input terminal A while the signal L is supplied to the input terminal B. Thereby, the transistor 61 is turned off and the transistor 62 is turned on. Thus, the negative voltage $V_L$ is supplied to the base of the transistors 50 and 53 via the load resistances 72 and 73, and the transistors 50 and 53 are both turned off. Other operations are identical to the case of the first embodiment and further description will be omitted. In this embodiment, too, the advantageous features described with reference to the first embodiment is obtained.

Further, the present invention is not limited to these embodiments described heretofore, but various variations and modifications may be possible within the scope of the invention.

What is claimed is:

1. A semiconductor memory device, comprising:
 a memory cell array includes a plurality of memory cells and a plurality of bit lines connected to the memory cells;
 a plurality of sense amplifiers each connected to a corresponding bit line for detecting data stored in a memory cell which is connected to the bit line, each of said sense amplifiers producing an output signal indicative of the detected data;
 a common data bus connected commonly to the plurality of sense amplifiers for transferring the data stored in the memory cell;
 a plurality of switching devices provided in correspondence to the plurality of sense amplifiers respectively for selectively transferring the data detected by the sense amplifier to the common data bus in response to an address signal supplied thereto, each of the switching devices including a) a bipolar transistor having a collector connected to a power voltage source, an emitter connected to the common data bus, and a base connected to the corresponding sense amplifier for receiving the output signal of the sense amplifier indicative of the data, each of said plurality of switching devices further including b) a first power voltage source for producing a first power voltage having a first voltage level, c) a second power voltage source for producing a second power voltage having a second voltage level, and d) a control circuit supplied with said address signal, said control circuit connected to said corresponding sense amplifier, said control circuit selectively activating the sense amplifier in response to the address signal by supplying said first power voltage from said first power voltage source to said sense amplifier for driving the sense amplifier when the sense amplifier is selected by the address signal, said control circuit deactivating the sense amplifier by supplying said second power voltage from said second power voltage source to said sense amplifier when the sense amplifier is not selected by the address signal, said second voltage level of said second power voltage being set such that no activation of the sense amplifier occurs, said control circuit includes a first MOS transistor having a source connected to said first power voltage source and a drain connected to the base of the first bipolar transistor forming the switching device, and a second MOS transistor having a source connected to the base of the first bipolar transistor commonly with the drain of the first MOS transistor and a drain connected to said second power source, said first and second MOS transistors having respective gates connected to a first and a second input terminals for receiving said address signal and a logic inversion signal of said address signal respectively, wherein said second power voltage is determined such that a base voltage sufficient to turn the first bipolar transistor off is supplied to the base of the first bipolar transistor when there is no address signal applied to the sense amplifier; and
 data discrimination means connected to the common data bus for producing an output data signal indicative of the data stored in the addressed memory cell in response to the output signal of the sense amplifier transferred along the common data bus.

2. A semiconductor memory device as claimed in claim 1 in which each of said sense amplifiers comprises a second bipolar transistor having a base connected to the bit line, a collector connected to the base of the first bipolar transistor, and an emitter connected to a current source which is turned on selectively in response to said address signal addressing the bit line to which the sense amplifier is connected.

3. A semiconductor memory device as claimed in claim 1 in which each of said bit lines includes a first bit line for transferring data stored in the addressed memory cell and a second bit line for transferring the data stored in the addressed memory cell with an inverted logic state; said common data bus includes a first data bus connected to the emitter of the first bipolar transistor and a second data bus; wherein each of the switching devices further includes a second bipolar transistor having a collector connected to the power voltage source, an emitter connected to the second data bus, and a base connected to the corresponding sense amplifier for receiving the output signal of the sense amplifier indicative of the data; and said sense amplifier including a third bipolar transistor having a base connected to the first bit line, a collector connected to the base of the first bipolar transistor and an emitter connected to a current source which is turned on ion response to the second address signal, and a fourth bipolar transistor having a base connected to the second bit line, a collector connected to the base of the second bipolar transistor and an emitter connected to the current source commonly with the emitter of the third bipolar transistor.

4. A semiconductor memory device as claimed in claim 3 in which said control unit includes a first MOS transistor having a source connected to said first power voltage source and a drain connected to the base of the first bipolar transistor forming the switching device, a second MOS transistor having a source connected to the base of the first bipolar transistor commonly with the drain of the first MOS transistor and a drain connected to said second power voltage source, said first and second MOS transistors having respective gates connected to a first and a second input terminals for receiving said address signal and a logic inversion signal of said address signal respectively, a third MOS transistor having a source connected to the first power voltage source and a drain connected to the base of the second bipolar transistor forming the switching device, a fourth MOS transistor having a source connected to the base of the second bipolar transistor commonly with the drain of the third MOS transistor and a drain connected to the second power voltage source, said third MOS transistor having a gate connected to the first input terminal commonly with the date of the first MOS transistor, said fourth MOS transistor having a gage connected to the second input terminal commonly with the gate of the second MOS transistor, wherein said second power voltage is determined such that a base voltage sufficient to turn the first and second bipolar transistors off is supplied to the base of the first and second bipolar transistors when there is no address signal applied to the sense amplifier.

5. A semiconductor memory device as claimed in claim 3 in which said control circuit includes a first MOS transistor having a source connected to said first power voltage source and a drain, a second MOS transistor having a source connected to the drain of the first MOS transistor and a drain connected to said second power voltage source, said drain of the first MOS transistor being connected to the base of the first bipolar transistor via a first resistance and to the base of the second bipolar transistor via a second resistance, said first and second MOS transistors having respective gates connected to a first and a second input terminals for receiving the second address signal and a logic inversion signal of the address signal respectively, wherein said second power voltage is determined such that a base voltage sufficient to turn the first and second bipolar transistors off is supplied to the base of the first and second bipolar transistors when there is no address signal applied to the sense amplifier.

* * * * *